United States Patent [19]
Norte

[11] Patent Number: 6,014,235
[45] Date of Patent: Jan. 11, 2000

[54] OPTICAL-LOOP BUFFER THAT ENHANCES THE EXTINCTION RATIO OF THE BUFFERED SIGNAL

[75] Inventor: David A. Norte, Westminster, Colo.

[73] Assignee: Lucent Technologies Inc., Murray Hill, N.J.

[21] Appl. No.: 08/868,294

[22] Filed: Jun. 3, 1997

[51] Int. Cl.$^7$ .................................................. H04B 10/00
[52] U.S. Cl. ............................................. 359/109; 372/38
[58] Field of Search ................................... 359/109, 110, 359/153, 161, 173, 179, 188, 194, 195; 372/9, 29, 38

[56] References Cited

U.S. PATENT DOCUMENTS

| | | | |
|---|---|---|---|
| 5,206,753 | 4/1993 | Grimes ..................................... | 359/128 |
| 5,450,229 | 9/1995 | Wiesenfeld .............................. | 359/238 |
| 5,506,712 | 4/1996 | Sasayama et al. ....................... | 359/123 |
| 5,563,898 | 10/1996 | Ikeuchi et al. ............................ | 372/38 |
| 5,566,261 | 10/1996 | Hall et al. ................................. | 385/27 |
| 5,732,096 | 3/1998 | Suzuki et al. ............................. | 372/38 |
| 5,739,943 | 4/1998 | Ohshima et al. ......................... | 359/281 |
| 5,740,117 | 4/1998 | Bona et al. ............................... | 365/215 |

FOREIGN PATENT DOCUMENTS

| | | | |
|---|---|---|---|
| 164628 | 6/1994 | Japan ..................................... | 359/109 |

OTHER PUBLICATIONS

P. Cinato et al., Architectural Analysis, Feasibility Study and First Experimental Results for a Photonic ATM Switching Module to be Employed in a Large Size Switching Network, ISS '95, World Telecommunications Congress, Apr. 1995, vol. 2, pp. 382–386.

R. Ludwig et al., Random Access Fiber Loop Optical Memory with Active Switching and Amplifying Elements for Optical ATM Systems, Proceedings of the European Conference on Optical Communication, Sep. 9, 1991, pp. 101–104.

G. Bendelli et al., Photonic ATM Switch Based on a Multiwavelength Fiber–Loop Buffer, Optical Fiber Communication, Summaries of Papers presented at the Conference OFC '95, San Diego, Feb. 26–Mar. 3, 1995, pp. 141–142.

*Primary Examiner*—Thomas Mullen
*Attorney, Agent, or Firm*—David Volejnicek

[57] ABSTRACT

An all-optical-loop buffer (100) that restores the extinction ratio of the buffered signal such as an ATM cell. The buffer takes advantage of the cross-gain compression and wavelength shifting effected by semiconductor optical amplifiers (SOAs 118, 132). A received signal ($\lambda_1$) is coupled (104) to the buffer loop (101), amplified (110), and combined (114) with a low-energy unmodulated second signal (116) at a different wavelength ($\lambda_2$). The combined signal is amplified by an SOA (118) to modulate the second signal with an inverse of the modulation of the first signal. The received signal is extracted (128) from the SOA's output and attenuated (126). The modulated second signal is extracted (124) from the SOA's output, amplified (122), and combined (130) with the extracted received signal. The combined signal is amplified by another SOA (132) to modulate the received signal with an inverse of the modulation of the second signal, thereby enhancing the extinction ratio of the received signal. The enhanced signal is then extracted (134) from the combined signal to substantially reproduce the signal as originally received. This signal may again be sent through the buffer loop, and the process may be repeated for as often as the signal needs to be buffered.

12 Claims, 1 Drawing Sheet

OPTICAL-LOOP BUFFER THAT ENHANCES THE EXTINCTION RATIO OF THE BUFFERED SIGNAL

TECHNICAL FIELD

This invention relates generally to lightwave systems and particularly to lightwave-signal buffers.

BACKGROUND OF THE INVENTION

Asynchronous transfer mode (ATM) is a widely-used communications packet-switching technology. All-optical ATM networks will almost inevitably have to buffer (temporarily store) optical ATM cells (packets) when routing the cells to their appropriate destinations. This storage requirement can be met by an all-optical-loop buffer, provided that the buffer can store the optical ATM cells for multiple circulations around the loop.

Implementations of all-optical-loop buffers for ATM cells have been demonstrated in the past. Most loop buffer implementations consist of semiconductor optical amplifiers (SOAs) and erbium-doped fiber amplifiers (EDFAs) that work in tandem to store an optical ATM cell for several circulations. These buffers have been able to store an ATM cell only for too-few circulations around the buffer and hence for too-short a period of time, due to the reduction of the extinction ratio of the circulating ATM cell as it loops around in the buffer. The extinction ratio is the ratio of the optical-energy level of a binary "1" to that of a binary "0" level of a modulated signal. A desirable extinction ratio is generally about 30dB or better. The reduction in the extinction ratio is caused by the increased saturation of the SOAs by the EDFAs as the cell repeatedly traverses the optical-loop buffer. Ideally, the cell's extinction ratio should not be degraded as a consequence of using the optical-loop buffer.

SUMMARY OF THE INVENTION

This invention is directed to solving these and other problems and disadvantages and meeting the needs of the prior art. Generally according to the invention, there is provided an optical-loop buffer that mitigates the reduction in the buffered signal's extinction ratio and substantially restores (e.g., maintains or increases) the buffered signal's extinction ratio to its original value, thereby extending the number of circulations, and hence the storage time, for which the buffered signal can remain in the buffer without the extinction ratio falling below an acceptable minimum.

The optical buffer comprises a coupler for coupling the modulated optical signal (e.g., an ATM cell) to the buffer, and an optical loop for storing the coupled modulated optical signal in optical form without decreasing the extinction ratio of the stored coupled modulated optical signal. The optical loop includes an optical amplifier apparatus for amplifying the stored modulated optical signal so as to restore the extinction ratio of the stored modulated optical signal, which ratio would otherwise deteriorate. The optical amplifier apparatus effects cross-gain compression and wavelength shifting on the stored modulated optical signal which has a first wavelength, and an initially-unmodulated second optical signal which has a second wavelength different from the first wavelength, to aid in restoring the extinction ratio of the stored modulated optical signal. Illustratively, the optical loop comprises an apparatus for modulating the second optical signal, which has a low energy relative to the (high) energy of the coupled modulated optical signal, with the inverse of the modulation of the coupled modulated optical signal, an apparatus for inverting the relative energies of the coupled modulated optical signal and the modulated second optical signal so as to make the former the low-energy signal and the latter the high-energy signal, and an apparatus for modulating the low-energy coupled modulated optical signal with the inverse of the modulation of the high-energy modulated second optical signal, thereby restoring the extinction ratio of the initial coupled modulated optical signal, and subsequently amplifying the restored coupled modulated optical signal to the high energy state. Illustratively, each of the modulating apparatuses comprises an optical amplifier (such as a SOA) that effects a cross-gain compression and wavelength shifting function.

Advantageously, the optical buffer restores the extinction ratio of the buffered signal and thereby extends the length of time for which the signal can be stored. Moreover, it does so using an architecture that can be constructed entirely of conventional optical components.

These and other advantages and features of the invention will become more apparent from the following description of an illustrative embodiment of the invention considered together with the drawing.

DETAILED DESCRIPTION

Figure 1:
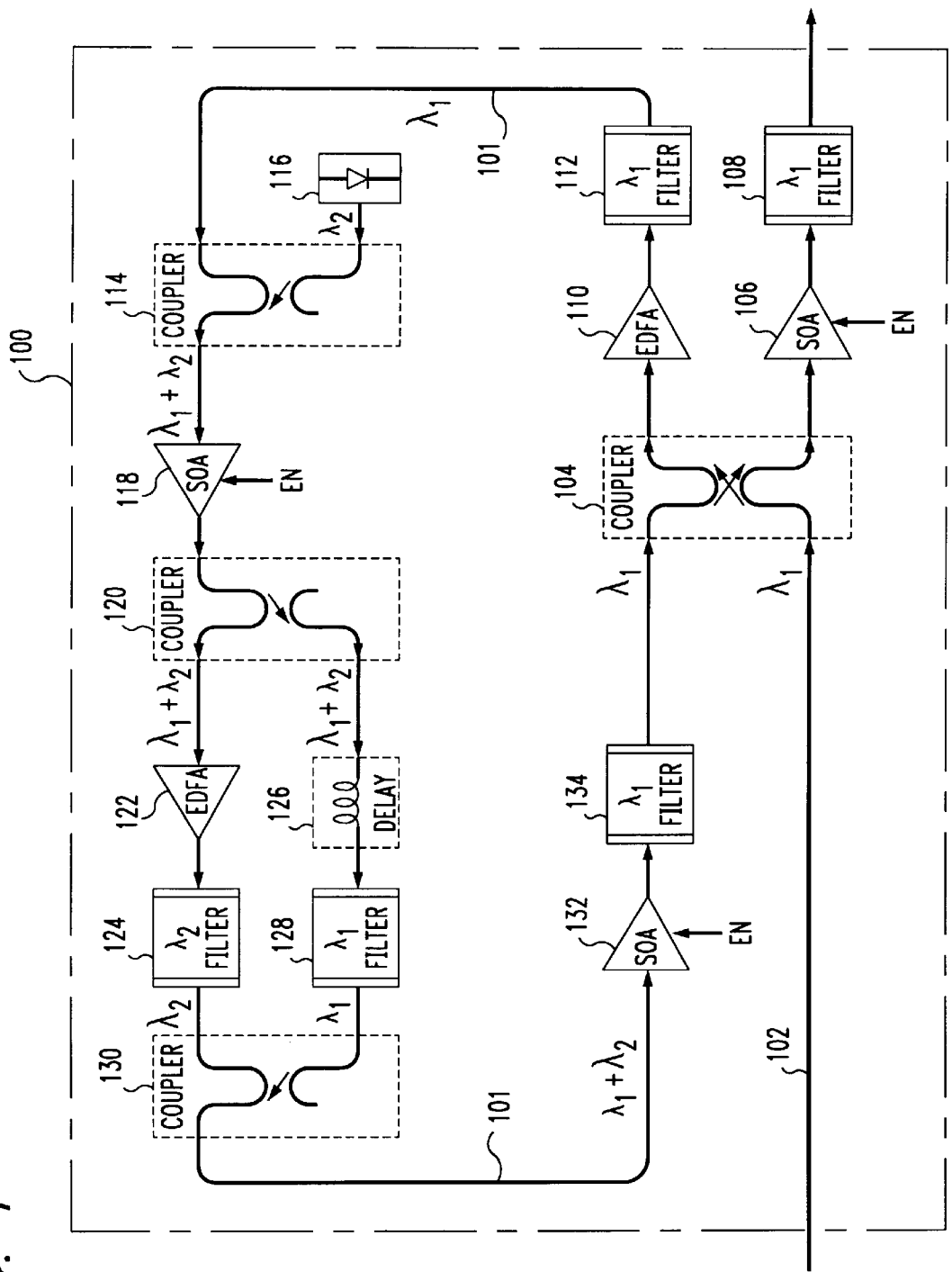
FIG. 1 is a circuit diagram of an all-optical loop buffer embodying an illustrative implementation of the invention.

The figure shows an all-optical-loop buffer 100 embodying an illustrative example of the invention. Buffer 100 is optically coupled by an optical coupler 104 to an optical transmission line —a fiber 102—which carries signals, such as ATM cells, modulated in binary form onto a carrier having a wavelength of $\lambda_1$. From the perspective of buffer 100, fiber 102 is both a source and a destination of the signals. Buffer 100 comprises an optical loop 101 having a signal-propagation length equal to the length in time of an ATM cell, whereby it can store an entire ATM cell at any one time. Coupler 104 diverts some of the energy of the signal from fiber 102 to buffer 100. Therefore, fiber 102 is connected at the output of coupler 104 to an SOA 106 which amplifies the optical signal, restoring it to its former energy level, and allowing the optical signal to exit buffer 100 after the required number of circulations. An optical filter 108 at the output of SOA 106 removes wavelengths other than $\lambda_1$, such as noise, from the output of SOA 106. SOA 106 also acts as an optical gate, a switch, under control of an enable (EN) electrical control signal. SOA 106 is typically enabled only when the stored ATM cell is ready to exit buffer 100; at other times, SOA 106 is disabled, thereby preventing the stored ATM cell from exiting buffer 100 before the required number of circulations.

The signal energy which coupler 104 diverts from fiber 102 to buffer 100 is input to an EDFA 110. An EDFA is not easily saturated, and has substantially constant gain at lightwave communications frequencies. EDFA 100 therefore linearly amplifies the signal, boosting it to a high-energy level without appreciable distortion, and also compensating for the 3-dB signal loss clue to coupler 104. At the high-energy level, the signal has relatively high-energy peaks (binary "1s") and relatively low-energy troughs (binary "0s"). An optical filter 112 at the output of EDFA removes wavelengths other than $\lambda_1$ from the output of EDFA 110, such as noise wavelengths operated by EDFA 110. The high-energy signal output of EDFA 110 and filter 112 is then input to an optical coupler 114, where it is combined with a low-energy steady-state (not modulated) signal having a wavelength $\lambda_2$ which is generated by a generator 116, such as a laser. The combined signals, comprising a high-energy binary signal component at a wavelength of $\lambda_1$ and a low-energy steady-state signal component at a wavelength of $\lambda_2$, are simultaneously input to SOA 118.

SOA 118 is easily saturated by a high-energy signal. It therefore exhibits high gain for low-energy signals and low gain for high-energy signals. It is also substantially wavelength-insensitive, so that it does not distinguish between the components of the combined signal, but rather treats them as a single signal in which the high-energy binary component signal at $\lambda_1$ dominates over the low-energy steady-state component signal at $\lambda_2$. Consequently, whenever the binary signal component is at a low-energy (binary "0") state, the combined signal is also at a low energy, and therefore undergoes high gain, and whenever the binary signal component is at a high-energy (binary "1") state, the combined signal is also at a high energy, and therefore undergoes low gain —an effect referred to as cross-gain compression. This reduces the extinction ratio of the binary component at $\lambda_1$. However, it also modulates, or imprints, the signal component at $\lambda_2$ with the inverse of the binary pattern of the signal component at $\lambda_1$ —an effect referred to as wavelength shifting. Thus, for example, if the binary signal component at $\lambda_1$ has the bit pattern "100101", the signal component at $\lambda_2$ now carries the bit pattern "011010".

The combined-signal output of SOA 118 is sent through an energy inverter comprising components 120–130 which inverts the relative energies of the two components of the combined signal. First, the combined-signal output of SOA 118 is split into two substantially identical signals by a 3 dB optical coupler 120. One of the signals is input to an EDFA 122, where it is amplified, and the amplified signal is filtered by an optical filter 124 to remove all wavelengths except 2, thereby producing a high-energy binary signal at $\lambda_2$ which is the binary inverse of the binary signal at $\lambda_1$. The other signal is transmitted through a path consisting of elements 120, 126, 128, and 130 whose combined losses act as an attenuator. This other signal is transmitted through an optical delay 126, where it is attenuated and delayed to compensate for any delay introduced in the one signal by EDFA 122, thus keeping the two signals synchronized at the output of coupler 130. The output of delay 126 is filtered by an optical filter 128 to remove all wavelengths except $\lambda_1$, thereby producing a binary signal at $\lambda_1$ that has low energy relative to the signal at $\lambda_2$ output by filter 124. The high-energy signal at $\lambda_2$ and the low-energy signal at $\lambda_1$ are combined by an optical coupler 130, and the combined signal is input to an SOA 132, where the extinction ratio restoration of the buffered signal at $\lambda_1$ takes place.

SOA 132 exhibits the same saturation characteristics as SOA 118, described above. In the combined signal received by SOA 132, the high-energy component signal at $\lambda_2$ dominates over the low-energy component signal at $\lambda_1$. Consequently, whenever the component signal at $\lambda_2$ is at a low-energy (binary"0") state, the combined signal is also at a low energy, and therefore undergoes high gain, and whenever the component signal at $\lambda_2$ is at a high-energy (binary "1") state, the combined signal is also at a high energy state, and therefore undergoes low gain. This reduces the extinction ratio of the component signal at $\lambda_2$. However, because the signal at $\lambda_2$ is the binary inverse of the component signal at $\lambda_1$, the resulting modulation of the component signal at $\lambda_1$ by the modulation of the component signal at $\lambda_2$ enhances the extinction ratio of the signal at $\lambda_1$.

The enhanced signal output by SOA 132 is filtered by an optical filter 134 to remove signals of all wavelengths but $\lambda_1$, and thus substantially reproduces the signal which was received on fiber 102. The reproduced signal at $\lambda_1$ is input to optical coupler 104 which couples some of the signal energy to the input of EDFA 110 and the rest of the signal energy to the input of SOA 106 on fiber 102. The portion of the signal on fiber 102 may be blocked or passed by SOA 106, while the portion of the signal input to EDFA 110 may be looped again through buffer 100, in the manner described above for the signal portion input to EDFA 110 from fiber 102.

Alternatively, coupler 104 may be replaced by an optical switch.

Like SOA 106, SOAs 118 and 132 also act as optical gates, switches, under control of their own enable (EN) control signals. To clear buffer 100, it is only necessary to disable SOA 1 18 and/or SOA 132 to stop propagation of a presently-buffered signal through the loop 101 of buffer 100. Preferably, to prevent the propagation of spurious signals, such as noise generated by SOAs 118 and 132, through the loop 101 of buffer 100, SOAs 118 and 132 are each enabled only when they have a desired signal available to them for amplification.

Of course, various changes and modifications to the illustrative embodiment described above will be apparent to those skilled in the art. For example, a same one buffer can be used to store a plurality of ATM cells, at input wavelengths other than $\lambda_1$. This only requires a bank of similar optical components for each input wavelength to be provided within the optical loop. Such changes and modifications can be made without departing from the spirit and the scope of the invention and without diminishing its attendant advantages. It is therefore intended that such changes and modifications be covered by the following claims.

The invention claimed is:

1. An optical buffer comprising:

a coupler, included in the optical buffer, for coupling a modulated optical signal to the buffer; and an optical loop for storing the coupled modulated optical signal in optical form without decreasing an extinction ratio of the stored coupled modulated optical signal.

2. The optical buffer of claim 1 wherein:

the optical loop includes an optical amplifier apparatus for amplifying the stored modulated optical signal so as to restore the extinction ratio of the stored modulated optical signal.

3. The optical buffer of claim 2 wherein:

the optical amplifier apparatus effects cross-gain compression and wavelength shifting on the stored modulated optical signal having a first wavelength and an initially-unmodulated second optical signal having a second wavelength different from the first wavelength to restore the extinction ratio of the stored modulated optical signal.

4. The optical buffer of claim 1 wherein:

the optical loop comprises an apparatus for modulating, with an inverse of modulation of the coupled modulated optical signal which has a first wavelength and a high energy, an unmodulated second optical signal having a second wavelength different from the first wavelength and a low energy relative to the high energy of the coupled modulated optical signal;

an apparatus connected to the modulating apparatus, for inverting the relative energies of the coupled modulated optical signal and the modulated second optical signal; and an apparatus connected to the inverting apparatus, for modulating the coupled modulated optical signal having the low energy with an inverse of the modulation of the modulated second optical signal having the high energy, thereby restoring the extinction ratio of the coupled modulated optical signal, and amplifying the coupled modulated optical signal to the high energy.

5. The optical buffer of claim 4 wherein:

each modulating apparatus comprises an optical amplifier that effects a cross-gain compression and wavelength shifting.

6. The optical buffer of claim 1 wherein:

the modulation comprises binary modulation.

7. The optical buffer of claim 6 wherein:

the modulated optical signal comprises an asynchronous transfer mode (ATM) cell.

8. An optical buffer comprising:

a first optical coupler, included in the optical buffer, for coupling a modulated first optical signal, having high-energy peaks and low-energy troughs and a first wavelength, from a source of the first optical signal to the buffer;

a source of an unmodulated second optical signal having a second wavelength different from the first wavelength and having a low energy relative to the high-energy peaks of the first optical signal;

a first combiner connected to the first optical coupler and the source, for combining the first optical signal and the second optical signal into a first combined optical signal;

a first amplifier connected to the first combiner and providing a low gain for an input signal while the input signal has a high energy and providing a high gain for the input signal while the input signal has a low energy, for amplifying the first combined optical signal to modulate the second optical signal included in the first combined optical signal with an inverse of modulation of the first optical signal included in the first combined optical signal;

a splitter connected to the first amplifier for splitting the amplified first combined optical signal into a second combined optical signal and a third combined optical signal;

an amplifier and filter connected to the splitter, for removing the first optical signal from the second combined optical signal and linearly amplifying the second optical signal from the second combined optical signal to produce an amplified second optical signal having high-energy peaks and low-energy troughs;

an attenuator and filter connected to the splitter, for removing the second optical signal from the third combined optical signal and attenuating the first optical signal from the third combined optical signal to produce an attenuated first optical signal having low-energy peaks relative to the high-energy peaks of the amplified second optical signal;

a second combiner connected to the amplifier and filter and to the attenuator and filter, for combining the attenuated first optical signal with the amplified second optical signal into a fourth combined optical signal;

a second amplifier connected to the second combiner, providing the low gain for an input signal while the input signal has a high energy and providing the high gain for the input signal while the input signal has a low energy, for amplifying the fourth combined optical signal to modulate the attenuated first optical signal included in the fourth combined optical signal with an inverse of the modulation of the amplified second optical signal included in the fourth combined optical signal, thereby increasing the extinction ratio of the attenuated first optical signal included in the fourth combined optical signal;

a filter connected to the second amplifier, for filtering out of the amplified fourth combined optical signal the amplified second optical signal included in the fourth combined optical signal to substantially reproduce the first optical signal; and a second optical coupler connected to the filter, for coupling the reproduced first optical signal to either of the first amplifier and a destination of the first optical signals.

9. The optical buffer of claim 8 wherein:

the first and the second optical couplers comprise a same one optical coupler.

10. The optical buffer of claim 8: further comprising a third amplifier, for linearly amplifying received modulated optical signals having the first wavelength to produce the modulated first optical signals having the high-energy peaks and the low-energy troughs; and wherein the first optical coupler is connected to the third amplifier, for coupling the received modulated optical signals from the source to the third amplifier.

11. The optical buffer of claim 8 wherein:

the modulation comprises binary modulation.

12. The optical buffer of claim 11 wherein:

the modulated first optical signal comprises an asynchronous transfer mode (ATM) cell.

* * * * *